United States Patent [19]

Tezuka et al.

[11] Patent Number: 5,086,436
[45] Date of Patent: Feb. 4, 1992

[54] CODED TRANSMISSION SYSTEM WITH INITIALIZING CODE

[75] Inventors: Koji Tezuka, Kawasaki; Shigeo Amemiya, Yokohama; Tomohiro Shinomiya, Kawasaki; Kazuo Iguchi, Yokohama; Tetsuo Soejima, Tokyo, all of Japan

[73] Assignee: Fujitsu Limited, Kawasaki, Japan

[21] Appl. No.: 529,326

[22] Filed: May 29, 1990

[30] Foreign Application Priority Data

May 27, 1989 [JP] Japan ................. 1-133599

[51] Int. Cl.⁵ .................. H04L 1/00; H04L 25/32
[52] U.S. Cl. .................. 375/25; 375/108; 341/73
[58] Field of Search ............. 375/17, 19, 22, 27, 375/37, 49, 95, 25, 108; 341/55, 56, 73; 455/608; 371/55; 360/40, 41, 42, 43, 49, 48

[56] References Cited

U.S. PATENT DOCUMENTS

| | | | |
|---|---|---|---|
| 4,337,457 | 6/1982 | Tache | 371/56 |
| 4,442,528 | 4/1984 | Fukuda | 341/73 |
| 4,503,546 | 3/1985 | Yoshine et al. | 375/37 |
| 4,562,422 | 12/1985 | Pospischill | 341/73 |
| 4,644,546 | 2/1987 | Doi et al. | 371/55 |
| 4,651,328 | 3/1987 | Den Hollander et al. | 375/25 |
| 4,837,782 | 6/1987 | Sasaki | 375/95 |
| 4,873,524 | 10/1989 | Akkermans | 341/73 |

FOREIGN PATENT DOCUMENTS 1-157142 6/1989 Japan.

*Primary Examiner*—Stephen Chin
*Attorney, Agent, or Firm*—Staas & Halsey

[57] ABSTRACT

A coded transmission system wherein each bit of transmitted data having a logical value is coded depending on a coded result of a preceding bit. The coded transmission system contains a sender-side apparatus, a transmission line, and a receiver-side apparatus. In the sender-side apparatus, a resetting bit and a message are generated; a code of a bit last transmitted which is necessary to code a bit which is to be transmitted next is memorized in a first preceding code memorizing circuit; and the content of the first preceding code memorizing circuit is reset to an initial code responding to the resetting bit. A coding circuit receives the resetting bit and the message, codes each bit of the message in accordance with a predetermined coding rule and the content of the first preceding code memorizing circuit, and codes the resetting bit to a predetermined resetting code which is different from the codes used in the coding of the message. In the receiver-side apparatus, a code of a bit last received which is necessary to decode a code of a bit which is received next is memorized in a second preceding code memorizing circuit. A resetting circuit resets a content of a second preceding code memorizing circuit to a predetermined initial code when receiving the resetting code. A decoding circuit decodes the received codes corresponding to the message in accordance with the predetermined coding rule and the content of the second preceding code memorizing circuit.

18 Claims, 5 Drawing Sheets

SYNCHRONIZATION PATTERN — REAL MESSAGE PORTION

ERRONEOUSLY RECOGNIZED SYNCHRONIZATION PATTERN — REAL MESSAGE PORTION

| A1 | A2 | S1 | B1 | B2 | S2 |
|----|----|----|----|----|----|
| 0  | 0  | 0  | 0  | 1  | 0  |
| 0  | 0  | 1  | 0  | 1  | 1  |
| 1  | 0  | 0  | 1  | 1  | 1  |
| 1  | 0  | 1  | 0  | 0  | 0  |
| —  | 1  | —  | 1  | 0  | 0  |

| C1 | C2 | S3 | D1 | D2 | S4 | S5 |
|----|----|----|----|----|----|----|
| 0  | 1  | 0  | 0  | 0  | 0  | 0  |
| 0  | 1  | 1  | 0  | 0  | 1  | 0  |
| 0  | 0  | 0  | 1  | 0  | 0  | 1  |
| 0  | 0  | 1  | 1  | 0  | 0  | 0  |
| 1  | 1  | 0  | 1  | 0  | 1  | 0  |
| 1  | 1  | 1  | 1  | 0  | 1  | 1  |
| 1  | 0  | —  | 0  | 1  | 0  | 0  |

CODED TRANSMISSION SYSTEM WITH INITIALIZING CODE

BACKGROUND OF THE INVENTION (1) Field of the Invention

The present invention relates to a coded transmission system wherein each bit of transmitted data having a logical value is coded depending on a coded result of a preceding bit. The present invention further relates to a line coding apparatus and a line decoding apparatus used in the above coded transmission system.

(2) Description of the Related Art

Line coding systems wherein each bit of data having a logical value is coded depending on a coded result of a preceding bit e.g., the bipolar coding system, or the CMI (coded mark inversion) coding system, are used for line coding of transmission of a logical value.

In the bipolar coding system, each bit of data having a logical value "0" is coded to a zero level, and each bit of the data having a logical value "1" is alternatively coded to a positive level and a negative level, i.e., each bit of the data having a logical value "1" is coded to the positive level when a preceding bit of the data having the logical value "1" is coded to the negative level, and each bit of the data having a logical value "1" is coded to the negative level when a precedicing bit of the data having the logical value "1" is coded to the positive level. In the CMI coding system, each bit of data having a logical value "0" is coded by changing the coded signal level from a zero ("0") level to a positive ("1") level in the center phase of one cycle, and each bit of the data having a logical value "1" is alternatively coded to the positive ("1") level and the zero ("0") level, i.e., each bit of the data having a logical value "1" is coded to the positive ("1") level when a preceding bit of the data having the logical value "1" is coded to the zero ("0") level, and each bit of the data having a logical value "1" is coded to the zero ("0") level a preceding bit of the data having the logical value "1" is coded to the positive ("1") level. In both coding systems, a code which does not accord with the above rules, is determined to be a violation of the rules, respectively, in the receiver side. Namely, in the above coding systems, a line decoder in the receiver side is required to memorize a coded mark (level) of a preceding bit of data having a logical value "1".

In the recent data transmission systems, high speed transmission is required. In particular, in data processing systems wherein a plurality of data processing apparatuses are connected with each other by data transmission lines, data is transmitted asynchronously between the apparatuses. In such asynchronous data transmission systems, use of the CMI coding is considered to be advantageous because the CMI coded signal can be relatively easily synchronized in the receiver side.

In the above asynchronous transmission systems wherein a plurality of data processing apparatuses are connected with each other by data transmission lines, a receiver in each of the data processing apparatuses or data transmission apparatuses receives coded signals which are transmitted from a plurality of data processing apparatuses or data transmission apparatuses. When the above line coding systems wherein each bit of data is coded depending on a coded result of a preceding bit, like the bipolar coding system, or the CMI coding system, are used for line coding in the above data transmission system, each receiver is required to memorize a coded mark (level) of a preceding bit of data having a logical value "1" for each of a plurality of data processing apparatuses or data transmission apparatuses from which coded signals are asynchronously transmitted to the receiver. However, such memorizing is very bothersome, and it is almost impossible.

In addition, in the above asynchronous data transmission systems, a synchronization pattern is transmitted preceding a real message portion. FIG. 1 shows an example of a beginning portion of a conventional asynchronous transmission signal using the CMI coding. In the example of FIG. 1, a synchronization pattern which is comprised of three synchronization bits "000" is transmitted preceding a real message portion, i.e., the CMI-coded level (010101) is transmitted preceding a CMI-coded real message portion. However, each bit of the synchronization pattern may be recognized erroneously because the receiver is generally not synchronized with the asynchronous transmission signal when receiving the synchronization pattern. FIG. 2 shows an example of an erroneously recognized beginning portion of a conventional asynchronous transmission signal using the CMI coding. In the example of FIG. 2, the code (01) of the second bit of the synchronization pattern is erroneously recognized as (11), i.e., the second bit of the synchronization pattern is erroneously recognized as "1". Responding to the recognition of the (11), the receiver memorizes the reception of the code (11), and when a bit of the real message having a logical value "1" is transmitted to the receiver with coded as (11) following the erroneous recognition, the receiver determines the received code (11) as a violation of the rule of the CMI coding.

Namely, in the above asynchronous data transmission systems wherein each bit of data is coded depending on a coded result of a preceding bit, as the above CMI coding, the coded signal may not be correctly decoded in the receiver side.

SUMMARY OF THE INVENTION

An object of the present invention is to provide a coded transmission system wherein each transmitted message can be correctly recognized in a receiver without being affected by a coded signal of a message which has been previously received at the receiver, or by an erroneous recognition of a bit of a synchronization pattern.

Another object of the preset invention is to provide a line coding apparatus and a line decoding apparatus used in the above coded transmission system.

According to the first aspect of the present invention, there is provided a coded transmission system wherein each bit of transmitted data having a logical value is coded depending on a coded result of a preceding bit, comprising a sender-side apparatus, a transmission line, and a receiver-side apparatus. The transmission line connects the sender-side apparatus with the receiver-side apparatus. the sender-side apparatus includes: a resetting bit generating circuit for generating and outputting a resetting bit; a first preceding code memorizing circuit for memorizing a code of a bit which is last transmitted and is necessary to code a bit which is to be transmitted next, where the content of the first preceding code memorizing circuit is reset to an initial code responding to the output of the resetting bit; a message generating circuit for generating and outputting a message which is to be transmitted to a receiver side after the output of the resetting bit; and a coding circuit for receiving the resetting bit and the message, coding each bit of the message in accordance with a predetermined coding rule and the content of the first preceding code memorizing circuit, and coding the resetting bit to a predetermined resetting code which is different from the codes used for the coding of the message. The receiver-side apparatus includes: a second preceding code memorizing circuit for memorizing a code of a bit which is last received and is necessary to decode a code of a bit which is received next; a receiving circuit for receiving the resetting code, and the message; a resetting circuit for resetting a content of the second preceding code memorizing circuit to a predetermined initial code when receiving the resetting code; and a decoding circuit for decoding received codes corresponding to the message in accordance with the predetermined coding rule and the content of the second preceding code memorizing circuit.

According to the second aspect of the present invention, there is provided a coded transmission system wherein each bit of transmitted data having a logical value is coded depending on a coded result of a preceding bit, comprising a sender-side apparatus, a transmission line, and a receiver-side apparatus. The transmission line connects the sender-side apparatus with the receiver-side apparatus. The sender-side apparatus includes: a first preceding code memorizing circuit for memorizing a code of a bit which is last transmitted and is necessary to code a bit which is to be transmitted next, where the content of the first preceding code memorizing circuit is reset to an initial code responding to the output of the resetting bit; a synchronization pattern generating circuit for generating and outputting a synchronization pattern; a resetting bit generating circuit for generating and outputting a resetting bit after the output of the synchronization pattern; a message generating circuit for generating and outputting a message which is to be transmitted to a receiver side after the output of the resetting bit; and a coding circuit for receiving the synchronization pattern, the resetting bit, and the message, coding each bit of the synchronization pattern and the message in accordance with a predetermined coding rule and the content of the first preceding code memorizing circuit, and coding the resetting bit to a predetermined resetting code which is different from the codes used for the coding of the synchronization pattern and the message. The receiver-side apparatus includes: a second preceding code memorizing circuit for memorizing a code of a bit which is last received, and is necessary to decode a code of a bit which is received next; a receiving circuit for receiving the synchronization pattern, the resetting code, and the message; a timing adjusting circuit for adjusting a timing of reception of signals in accordance with the timing of the synchronization pattern when receiving the synchronization pattern; a resetting circuit for resetting a content of the second preceding code memorizing circuit to a predetermined initial code when receiving the resetting code; and a decoding circuit for decoding received codes corresponding to the message in accordance with the above predetermined coding rule and the content of the second preceding code memorizing circuit.

DESCRIPTION OF THE PREFERRED EMBODIMENTS

Figure 1:
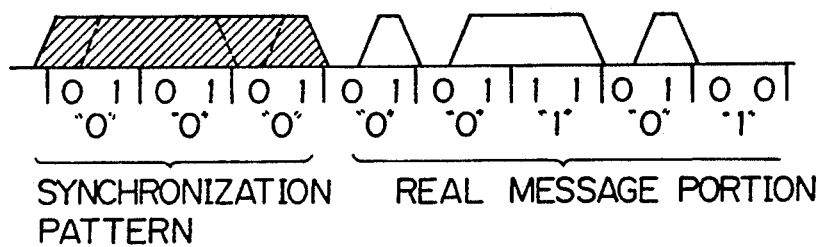
FIG. 1 shows an example of a beginning portion of a conventional asynchronous transmission signal using the CMI coding.
Figure 2:
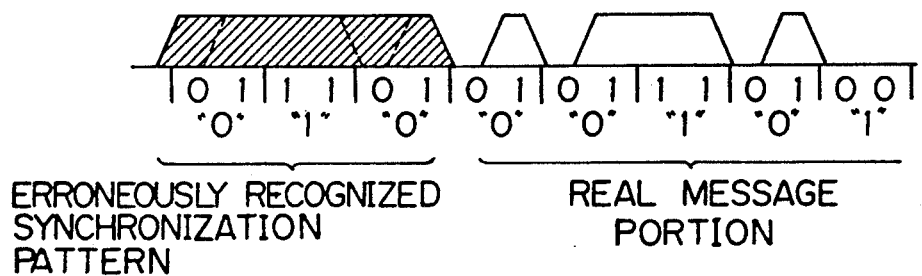
FIG. 2 shows an example of an erroneously recognized beginning portion of a conventional asynchronous transmission signal using the CMI coding.

(1) Basic Operations of First and Second Aspects of the Present Invention

Before describing the preferred embodiment of the present invention in detail, first, the basic operations of the various aspects of the present invention are explained below.

According to the first aspect of the present invention, in the sender-side apparatus, first, a resetting bit is generated in the resetting bit generating circuit, and next, a message is generated in the message generating circuit. Responding to the generated resetting bit, the content of the first preceding code memorizing circuit is reset to an initial code, where the first preceding code memorizing circuit memorizes a code of a bit which is last transmitted from the sender-side apparatus. The resetting bit is coded to a resetting code, and the resetting code is transmitted to the receiver-side apparatus through the transmission line. Next, each bit of the message is coded in a predetermined rule and the content of the first preceding code memorizing circuit, where the predetermined rule determines the manner of the coding wherein each bit of transmitted data having a logical value is coded depending on a coded result of a preceding bit. In the receiver-side apparatus, first, the above resetting code is received. Responding to the reception of the resetting code, the content of the second preceding code memorizing circuit is reset to an initial code. Following the resetting code, each bit of the message is received, and is decoded in the decoding circuit in accordance with the predetermined rule and the content of the second preceding code memorizing circuit. Since both the contents of the first preceding code memorizing circuit in the sender-side apparatus and the second preceding code memorizing circuit in the receiver-side apparatus are reset to an initial code before coding a message and before decoding the coded signal of the message for each transmission of a message, coding of each message and decoding of the coded signal of the message are begun from the same initial condition using the same initial code. Therefore, even when the receiver-side apparatus independently receives coded signals of messages from a plurality of sender-side apparatuses, a coded signal of each message can be correctly decoded in the receiver-side apparatus without being affected by a coded signal of a message which has been previously received.

According to the second aspect of the present invention, in the sender-side apparatus, first, a synchronization pattern is generated in the synchronization pattern generating circuit, secondly, a resetting bit is generated in the resetting bit generating circuit, and then, a message is generated in the resetting bit generating circuit. The synchronization pattern is coded in accordance with a predetermined rule, and the coded signal is transmitted to the receiver-side apparatus through the transmission line. Next, responding to the generated resetting bit, the content of the first preceding code memorizing circuit is reset to an initial code, where the first preceding code memorizing circuit memorizes a code of a bit which is last transmitted from the sender-side apparatus. The resetting bit is coded to a resetting code, and the resetting code is transmitted to the receiver-side apparatus through the transmission line. Then, each bit of the message is coded in a predetermined rule and the content of the first preceding code memorizing circuit, where the predetermined rule determines the manner of the coding wherein each bit of transmitted data having a logical value is coded depending on a coded result of a preceding bit. In the receiver-side apparatus, first, the above coded signal of the synchronization pattern is received, and the timing of reception of signals is adjusted in accordance with the received synchronization pattern. Next, the resetting coded is received. Responding to the reception of the resetting code, the content of the second preceding code memorizing circuit is reset to an initial code. Following the resetting code, each bit of the message is received, and is decoded in the decoding circuit in accordance with the predetermined rule and the content of the second preceding code memorizing circuit. Since both the contents of the first preceding code memorizing circuit in the sender-side apparatus and the second preceding code memorizing circuit in the receiver-side apparatus are reset to an initial code before coding a message and before decoding the coded signal of the message for each transmission of a message, similar to the above first aspect of the present invention, coding of each message and decoding of the coded signal of the message are begun from the same initial condition using the same initial code. Therefore, even when the receiver-side apparatus independently receives coded signals of messages from a plurality of sender-side apparatuses, a coded signal of each message can be correctly decoded in the receiver-side apparatus without being affected by a coded signal of a message which has been previously received. In addition, since the resetting code is transmitted after the synchronization pattern and before the coded signals of the message, the decoding of the message can be correctly carried out without being affected by an erroneous recognition of a bit of a synchronization pattern.

(2) Details of the Preferred Embodiment

Figure 3:
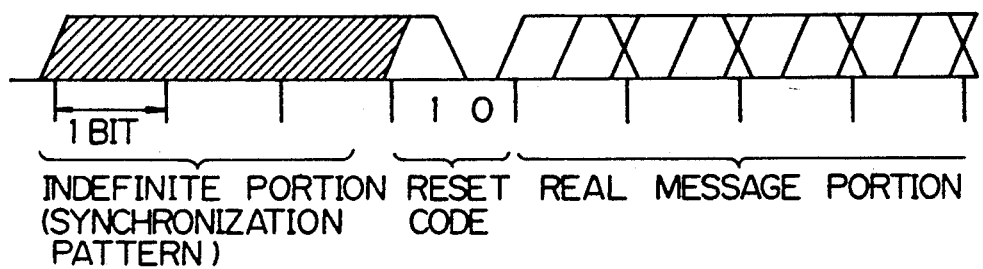
FIG. 3 shows an example of the insertion of the initializing (resetting) bit according to the present invention.

FIG. 3 shows an example of the insertion of the initializing (resetting) bit according to the present invention in the case the CMI coding is used. Since the code mark (10) is not used in the normal CMI coding rule, the code mark (10) is defined as the resetting code in the embodiment of the present invention, and is inserted between the synchronization pattern and a real message portion in each asynchronous transmission bit sequence.

Figure 4:
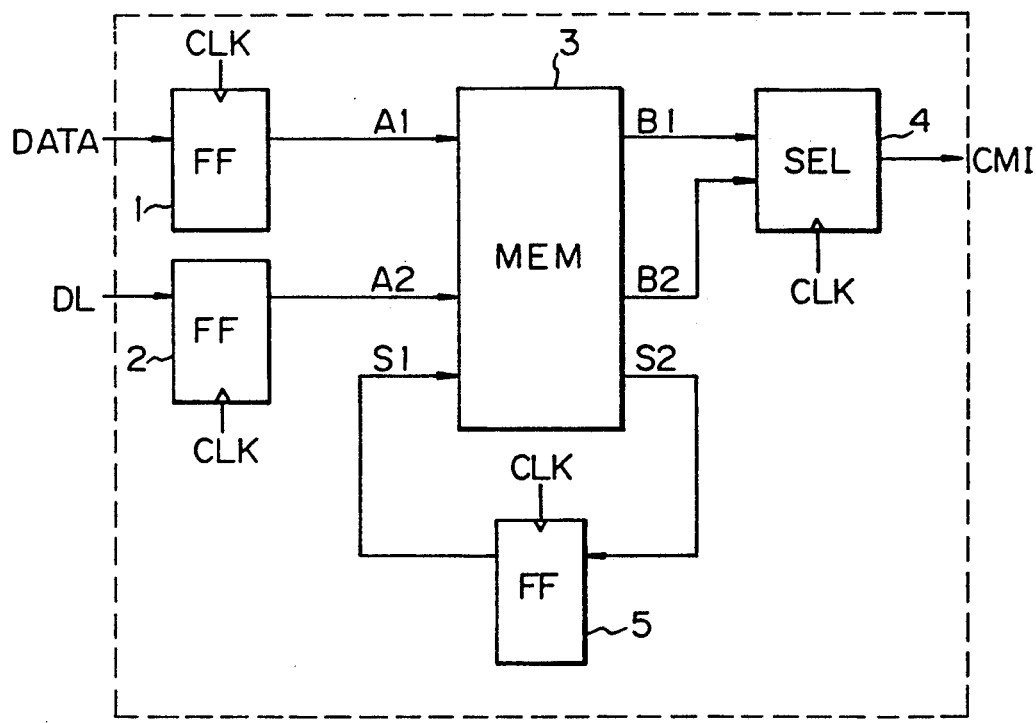
FIG. 4 shows an embodiment of the line coder according to the present invention.

FIG. 4 shows an embodiment of the line coder according to the present invention. The line coder of FIG. 4 is provided in the sender-side apparatus for coding bit sequence which includes a synchronization pattern, a resetting bit, and a real message portion which contains an indication of an address, an indication of a sender, and information which is to be transmitted to the receiver side. In FIG. 4, reference numerals 1, 2, and 5 each denote a flip-flop circuit, 3 denotes a memory circuit, 4 denotes a selector, and DL denotes a resetting bit, and CMI denotes a coded signal on the transmission line.

Figures 5, 6:
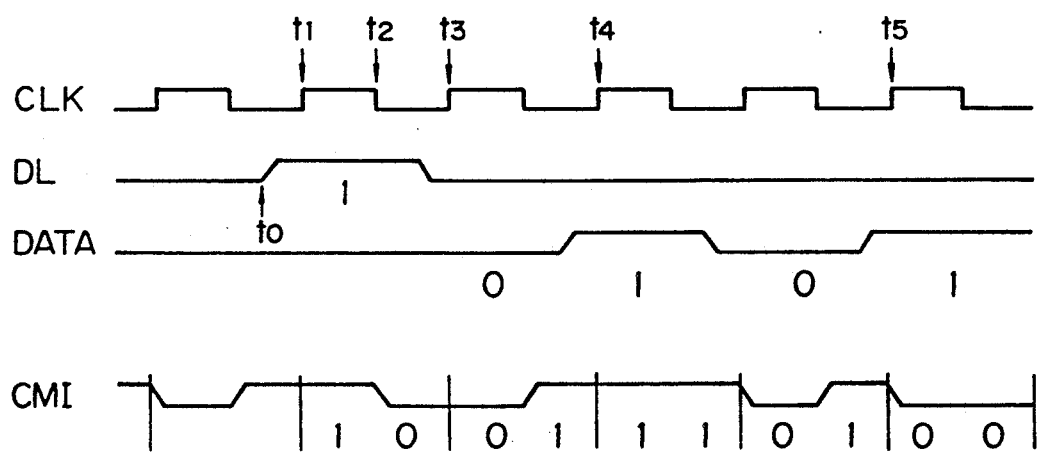
FIG. 5 shows the input-output relationship in the memory 3 in FIG. 4.
FIG. 6 shows an example of the operation of the construction of FIG. 4.

The flip-flop circuit 1 serially receives each bit of the synchronization pattern and the message at its data input terminal. The input signal of the flip-flop circuit 1 is denoted by DATA. The synchronization pattern is generated in a pattern generator in a communication control circuit which is not shown but generation of a synchronization pattern is well known in the conventional communication technique, and the message are generated in a data processing portion in the sender-side apparatus which is not shown because the generation of the message is not the characteristic feature of the present invention. The resetting bit DL is generated in the above communication control circuit. The resetting bit DL is made active "1" by the communication control circuit after the generation of the synchronization pattern, and is supplied to a data input terminal of the flip-flop circuit 2 after all bits of the synchronization pattern have been supplied to the flip-flop circuit 1 from the data, and in the other instances, the resetting bit DL is inactive "0". The above input of the flip-flop circuits 1 and 2 are latched in the flip-flop circuits 1 and 2, respectively, and the outputs of the flip-flop circuits 1 and 2 are respectively applied to the input terminals A1 and A2 of the memory circuit 3. The output of the flip-flop circuit 5 is applied to the other input terminal S1 of the memory circuit 3. The memory circuit 3 outputs B1, B2, and S2 signals responding to the above inputs A1, A2, and S1, and the input-output relationship of the memory 3 is shown in FIG. 5. The output S2 is applied to the data input terminal of the flip-flop circuit 5, and is latched in the flip-flop circuit 5. All the flip-flop circuits 1, 2, and 5 operates synchronized with a clock signal CLK which synchronizes with each bit of the synchronization pattern and the message. The outputs B1 and B2 are applied to the selector 4, and the selector 4 selects one of its inputs B1 and B2 as its output. The selector 4 receives the above clock signal CLK as its selection control signal. The duty ratio (mark ratio) of the clock is 50%, and therefore, the selector 4 selects the signal B1 in a half cycle of the clock CLK, and selects the signal B2 in the other half cycle of the clock CLK for each bit. The output of the selector 4 is the above-mentioned coded output CMI of the line coder of FIG. 4.

When the resetting bit DL is "0" and a bit of data which is applied to the flip-flop circuit 1 is "0", i.e., correspondingly, both the inputs A1 and A2 are "0", the output B1 is "0" and the output B2 is "1" regardless of the input S1, and the output S2 is the same as the input S1 at the instance. Namely, the content of the flip-flop circuit 5 is unchanged when both the inputs A1 and A2 are "0". Thus, the CMI-coded output from the selector 4 corresponding to a data bit "0" is (01).

When the resetting bit DL is "0" and a bit of data which is applied to the flip-flop circuit 1 is "1", i.e., correspondingly, the input A1 is "1" and the input A2 is "0", the outputs (B1, B2) are (1, 1) and (0, 0) depending on whether the input S1 at the instance is "0" or "1", respectively. When a bit of data which is applied to the flip-flop circuit 1 is "1", the content of the flip-flop circuit 5 is changed from "1" to "0", or from "0" to "1", the changed output S2 is latched in the flip-flop circuit 5, and is applied to the input terminal S1 of the memory circuit 3 in the next cycle. Thus, the CMI-coded output from the selector 4 corresponding to a data bit "0" alternatively becomes (11) and (00).

When the resetting bit DL is "1", and correspondingly the input A2 becomes "1", the outputs (B1, B2) are (1, 0) regardless of the input A1 of the memory circuit 3, and the output S2 becomes "0". Thus, the resetting code (10) is output from the selector 4, and the output of the flip-flop circuit 5 is reset to "0".

FIG. 6 shows an example of the operation of the construction of FIG. 4. At the time t0, the resetting bit DL becomes "1". At the time t1, the clock signal CLK rises, the "1" state of the resetting bit DL is latched in the flip-flop circuit 2, and the output of the flip-flop circuit 2 is applied to the memory circuit 3 as the input A2. Responding to the "1" state of the input A2, the output CMI of the selector 4 becomes "1", and then, the output CMI of the selector 4 becomes "0" responding to the fall of the clock signal CLK at the time t2. When the resetting bit DL returns to "0", the output of the flip-flop circuit 2 is reset to "0" at the time t3, and thereafter, the selector 4 outputs a CMI-coded signal responding to each input bit DATA of the flip-flop circuit 1.

Figures 7, 8:
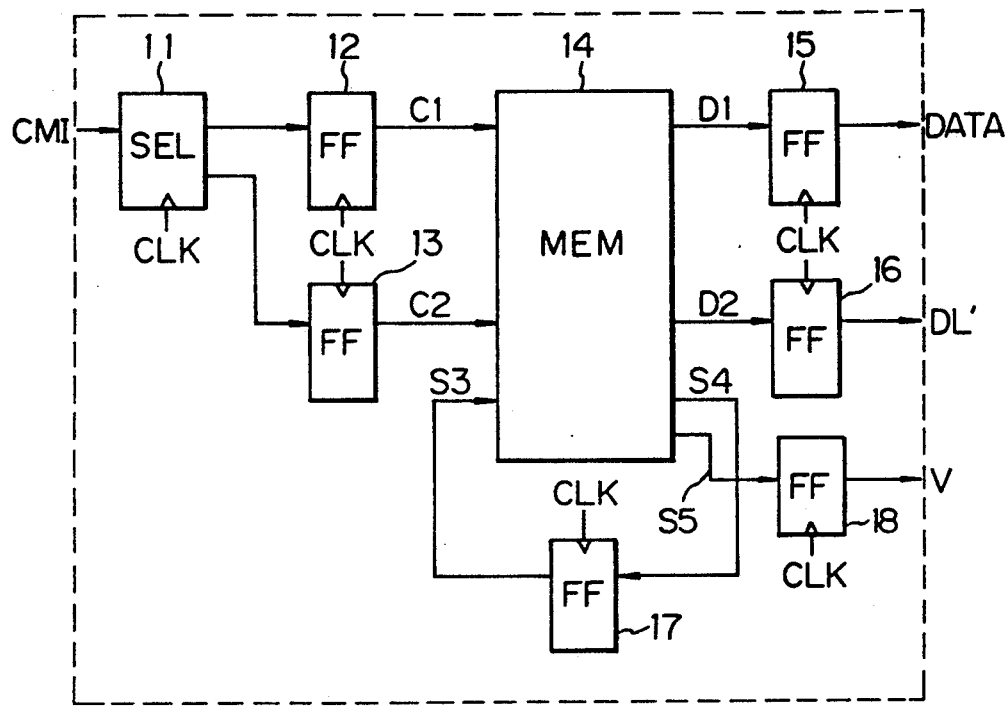
FIG. 7 shows an embodiment of the line decoder according to the present invention.
FIG. 8 shows the input-output relationship in the memory 14 in FIG. 7.

FIG. 7 shows an embodiment of the line decoder according to the present invention. The line decoder of FIG. 7 is provided in the receiver-side apparatus for decoding coded signals corresponding to the above-mentioned bit sequence which includes a synchronization pattern, a resetting bit, and a real message portion which contains an indication of an address, and indication of a sender, and information which is to be transmitted to the receiver side. In FIG. 7, reference numeral 11 denotes a selector, 12, 13, 15, 16, 17, and 18 each denote a flip-flop circuit, 14 denotes a memory circuit, and DL' denotes a decoded resetting bit, CMI denotes the above-mentioned coded signal on the transmission line, CLK denotes a receiving clock, DATA denotes a decoded bit, and V denotes a violation bit.

The selector 11 serially receives the above coded signal at its data input terminal. The selector 11 has two output terminals, and receives the receiving clock CLK at its control input terminal. The receiving clock CLK is extracted from the received coded signal, and the duty ratio of the clock signal is 50%. Thus, the selector 11 delivers its input to one of its two output terminals, alternatively, for every half cycle of the receiving clock CLK. Since the CMI-coded signals are defined by their signal levels in every half cycle as explained before, a signal level of the CMI-coded signal in the first half of each cycle of the receiving clock CLK is delivered to the flip-flop circuit 12, and a signal level of the CMI-coded signal in the second half of each cycle of the receiving clock CLK is delivered to the flip-flop circuit 13. These delivered signal levels are respectively latched in the flip-flop circuits 12 and 13 at each rising time of the receiving clock CLK. All the flip-flop circuits 12, 13, 15, 16, and 17 operate synchronized with the receiving clock signal CLK. The outputs of the flip-flop circuits 12 and 13 are respectively applied to the input terminals C1 and C2 of the memory circuit 14. The output of the flip-flop circuit 17 is applied to the other input terminal S3 of the memory circuit 14. The memory circuit 14 outputs D1, D2, S4, and S5 signals responding to the above inputs C1, C2, and S3, and the input-output relationship of the memory 14 is shown in FIG. 8. The output S4 is applied to the data input terminal of the flip-flop circuit 17, and is latched in the flip-flop circuit 17. The output signals D1 and D2 of the memory circuit 14 are respectively applied to the flip-flop circuits 15 and 16, and are respectively latched in the flip-flop circuits 15 and 16. The flip-flop circuit 15 serially outputs decoded bit sequence DATA, and the flip-flop circuit 16 outputs a decoded resetting bit DL'. The output S5 of the memory circuit 14 is latched in the flip-flop circuit 18, and is then output as a violation bit V. The above decoded results DATA and DL', and V are supplied to a data processing portion in the receiver-side apparatus which is not shown.

When the received CMI code is (01), and correspondingly, the inputs C1 and C2 are (0, 1), the output D1 of the memory circuit 14 is "0", and the output S4 is the same as the input S3 at the instance. Namely, when the received CMI code is (01), the content of the flip-flop circuit 17 is unchanged. In addition, the output D2 is "0". Thus, the decoded bit "0" of the received CMI code (01) is obtained through the flip-flop circuit 15, and the decoded result DL' of the resetting code, which is obtained through the flip-flop circuit 16, is "0".

When the received CMI code is (11), and correspondingly, the inputs C1 and C2 are (1, 1), the output D1 of the memory circuit 14 is "1", and the output S4 is "1". In addition, the output D2 is "0". Thus, the decoded bit "1" of the received CMI code (11) is obtained through the flip-flop circuit 15, and the decoded result DL' of the resetting code, which is obtained through the flip-flop circuit 16, is "0".

Similar to the above, when the received CMI code is (00), and correspondingly, the inputs C1 and C2 are (0, 0), the output D1 of the memory circuit 14 is "1", and the output S4 is "0". In addition, the output D2 is "0". Thus, the decoded bit "1" of the received CMI code (00) is obtained through the flip-flop circuit 15, and the decoded result DL' of the resetting code, which is obtained through the flip-flop circuit 16, is "0".

When the received CMI code is (10), and correspondingly, the inputs C1 and C2 are (1, 0), the output D2 is "1". In addition, the outputs D1 and S4 of the memory circuit 14 are "0". Thus, the decoded resetting bit "1" of the resetting code (10) is obtained as the output DL' the flip-flop circuit 16, and the decoded bit DATA of the received code, which is obtained through the flip-flop circuit 15, is "0". The content S3 of the flip-flop circuit 17 is reset to "0" responding to the reception of the above output S4, corresponding to that the above line coder of FIG. 4 is constructed so that the first bit having a logical value "1" in each bit sequence following a resetting bit, is coded to (11). Further, the above-mentioned data processing portion in the receiver-side apparatus ignores the bit DATA, and recognizes the beginning of the real message portion in a bit sequence when the resetting bit DL' is "1".

When the CMI code (00) is repeatedly received, i.e., all of the inputs C1, C2, and S3 are "0", the output S5 of the memory circuit 14 becomes "1", and thus the violation bit V becomes "1". Similarly, when the CMI code (11) is repeatedly received, i.e., all of the inputs C1, C2, and S3 are "1", the output S5 of the memory circuit 14 becomes "1", and thus the violation bit V becomes "1".

Figure 9:
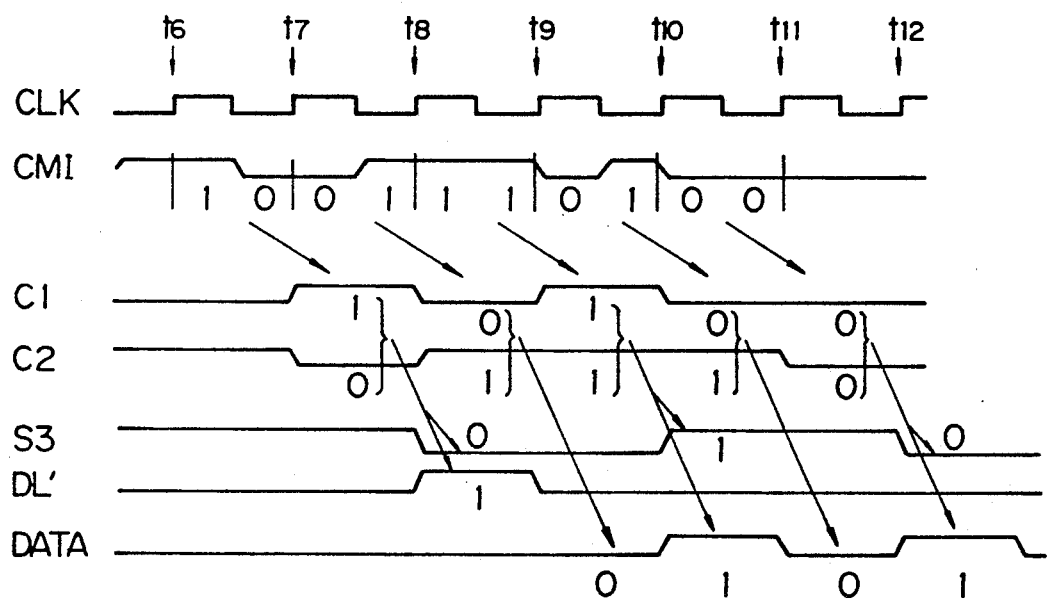
FIG. 9 shows an example of the operation of the construction of FIG. 7.

FIG. 9 shows an example of the operation of the construction of FIG. 7. At the time t6, the resetting code (10) is received, "1" is latched in the flip-flop circuit 12 and "0" is latched in the flip-flop circuit 12, i.e., the inputs C1 and C2 respectively become "1" and "0" at the next rising time t7 of the receiving clock. Responding to the above inputs C1 and C2 (1, 0), the decoded resetting bit DL' becomes "1", and the output S3 of the flip-flop circuit 17 is reset to "0" at the next rising time t8 of the receiving clock. In parallel to the above operation, at the time t7, the CMI code (01) is received, "0" is latched in the flip-flop circuit 12 and "1" is latched in the flip-flop circuit 12, i.e., the inputs C1 and C2 respectively become "0" and "1" at the next rising time t8 of the receiving clock. Responding to the above inputs C1 and C2 (0, 1), the decoded bit DATA becomes "0", the output DL' of the flip-flop circuit 16 becomes "0", and the output S3 of the flip-flop circuit 17 is unchanged at the next rising time t9 of the receiving clock. Further, in parallel with the above operation, at the time t8, the CMI code (11) is received, "1" is latched in the flip-flop circuit 12 and "1" is latched in the flip-flop circuit 12, i.e., the inputs C1 and C2 respectively become "1" and "1" at the next rising time t9 of the receiving clock. Responding to the above inputs C1 and C2 (1, 1), the decoded bit DATA becomes "1", the output DL' of the flip-flop circuit 16 is "0", and the output S3 of the flip-flop circuit 17 is changed to "1" at the next rising time t10 of the receiving clock. Next, in parallel with the above operation, at the time t9, the CMI code (01) is received, "0" is latched in the flip-flop circuit 12 and "1" is latched in the flip-flop circuit 12, i.e., the inputs C1 and C2 respectively become "0" and "1" at the next rising time t10 of the receiving clock. Responding to the above inputs C1 and C2 (0, 1), the decoded bit DATA becomes "0", the output DL' of the flip-flop circuit 16 is "0", and the output S3 of the flip-flop circuit 17 is unchanged at the next rising time t11 of the receiving clock. Further, in parallel with the above operation, at the time t10, the CMI code (00) is received, "0" is latched in the flip-flop circuit 12 and "0" is latched in the flip-flop circuit 12, i.e., the inputs C1 and C2 respectively become "0" and "0" at the next rising time t11 of the receiving clock. Responding to the above inputs C1 and C2 (0, 0), the decoded bit DATA becomes "1", the output DL' of the flip-flop circuit 16 is "0", and the output S3 of the flip-flop circuit 17 is changed to "0" at the next rising time t12 of the receiving clock.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly all suitable modifications and equivalents may be resorted to as falling within the scope of the invention.

What is claimed is:

1. A coded transmission system for transmitting data including a resetting bit and a message, wherein each bit of transmitted data, having a logical value, is coded depending on a coded result of a bit most recently transmitted before said each bit, said coded transmission system comprising:

sending-side apparatus including at least first preceding code memorizing means for memorizing a first stored code representing a code of a bit last transmitted to code a bit to be transmitted next, and for resetting the first stored code to an initial code which indicates a start of a message in response to the resetting bit;

coding means for receiving the resetting bit and the message, for coding each bit of the message in accordance with a predetermined coding rule and the first stored code to produce a coded result, and for coding the resetting bit to a predetermined resetting code, the predetermined resetting code is different from the codes used in the coding of the message; and transmitting means for transmitting the predetermined resetting code and for transmitting the coded result of the message after the transmission of the resetting code;

receiver-side apparatus including at least second preceding code memorizing means for memorizing a second stored code representing a code of a bit last received to decode a code of a bit received next;

receiving means for receiving the predetermined resetting code, and the coded result of the message;

resetting means for resetting the second stored code to the initial code in response to the predetermined resetting code; and decoding means for decoding the coded result received corresponding to the message in accordance with the predetermined coding rule and the code memorized by said second preceding code memorizing means; and transmission line means for connecting said sender-side apparatus with said receiver-side apparatus.

2. A line coding apparatus provided in a sender side of a coded transmission system, the coded transmission system transmits data, the data transmitted corresponds to a resetting bit and a message, each bit of the data transmitted having a logical value is coded depending on a coded result of a preceding bit, said apparatus comprising:

preceding code memorizing means for memorizing a stored code representing a code of a bit last transmitted to code a bit to be transmitted next, and for resetting the stored code to an initial code which indicates a start of a message in response to the resetting bit; and coding means for receiving the resetting bit and the message to be transmitted after the resetting bit, for coding each bit of the message in accordance with a predetermined coding rule and the stored code, and for coding the resetting bit to a predetermined resetting code, the predetermined resetting code is different from the codes used for the coding of the message.

3. An apparatus provided in a sender side of a coded transmission system for transmitting data including a resetting bit and a message, wherein each bit of transmitted data, having a logical value, is coded depending on a coded result of a bit, most recently transmitted before said each bit, said apparatus comprising:

preceding code memorizing means for memorizing a stored code representing a code of a bit last transmitted to code a bit to be transmitted next, and for resetting the stored code to an initial code which indicates a start of a message in response to the resetting bit;

coding means for receiving the resetting bit and the message, for coding each bit of the message in accordance with a predetermined coding rule and the stored code to produce a coded result, and for coding the resetting bit to a resetting code, the resetting code is different from the codes used for the coding of the message; and transmitting means for transmitting the resetting code, and for transmitting the coded result of the message after transmission of the resetting code.

4. A line decoding apparatus provided in a receiver side of a coded transmission system for receiving coded data, the coded data includes a coded result and a resetting code, each bit of the coded data having a logical value is coded depending on the coded result of a preceding bit, said apparatus comprising:

preceding code memorizing means for memorizing a stored code representing a code of a bit last received to decode a code of a bit received next;

resetting means for resetting the stored code to a predetermined initial code which indicates a start of a message in response to the resetting code; and decoding means for decoding the coded result received corresponding to the message in accordance with a predetermined coding rule and the stored code.

5. A line decoding apparatus according to claim 4, wherein said apparatus further comprises violation detecting means for detecting a violation of the predetermined coding rule in the coded data.

6. A coded transmission system for transmitting data including a synchronization pattern, a resetting bit, and a message, wherein each bit of transmitted data, having a logical value, is coded depending on a coded result of a bit most recently transmitted before said each bit, said coded transmission system comprising:

sender-side apparatus including at least first preceding code memorizing means for memorizing a first stored code representing a code of a bit last transmitted to code a bit to be transmitted next, and for resetting the first stored code to an initial code which indicates a start of a message in response to the resetting bit;

coding means for receiving the synchronization pattern, the resetting bit, and the message, for coding each bit of the synchronization pattern and the message in accordance with a predetermined coding rule and the first stored code to respectively produce a synchronization code and a coded message, and for coding the resetting bit to a predetermined resetting code, the predetermined resetting code is different from the codes used in the coding of the synchronization pattern and the message; and transmitting means for transmitting the synchronization code of said synchronization pattern, for transmitting the resetting code after the transmission of the synchronization code, and for transmitting the coded message after the transmission of the resetting code;

receiver-side apparatus including at least second preceding code memorizing means for memorizing a second stored code representing a code of a bit last received to decode a code of a bit received next;

receiving means for receiving the synchronization code, the predetermined resetting code, and the coded message;

resetting means for resetting the second stored code to the initial code in response to the predetermined resetting code;

decoding means for decoding the coded message in accordance with the predetermined coding rule and the second stored code; and transmission line means for connecting said sender-side apparatus with said receiver-side apparatus.

7. A line coding apparatus provided in a sender side of a coded transmission system, the coded transmission system transmits data, the data transmitted corresponds to a resetting bit and a message, each bit of the data transmitted having a logical value is coded depending on a coded result of a preceding bit, said apparatus comprising:

preceding code memorizing means for memorizing a stored code representing code of a bit last transmitted to code a bit to be transmitted next, and for resetting the stored code to an initial code which indicates a start of a message in response to the resetting bit; and coding means for receiving a synchronization pattern, the resetting bit after the reception of the synchronization pattern, and the message to be transmitted after the resetting bit, for coding each bit of the synchronization pattern and the message in accordance with a predetermined coding rule and the stored code, and for coding the resetting bit to a predetermined resetting code, the predetermined resetting code is different from the codes used for the coding of the synchronization pattern and the message.

8. A sender-side apparatus provided in a sender side of a coded transmission system for transmitting data including a synchronization pattern, a resetting bit and a message, wherein each bit of transmitted data, having a logical value, is coded depending on a coded result of a bit most recently transmitted before said each bit, said apparatus comprising:

preceding code memorizing means for memorizing a stored code representing a code of a bit last transmitted to code a bit to be transmitted next, and for resetting the stored code to an initial code which indicates a start of a message in response to the resetting bit;

coding means for receiving the synchronization pattern, the resetting bit, and the message, for coding each bit of the synchronization pattern and the message in accordance with a predetermined coding rule and the stored code to respectively produce a synchronized code and a coded result, and for coding the resetting bit to a resetting code, the resetting code is different from the codes used for the coding of the synchronization pattern and the message; and transmitting means for transmitting the synchronized code of the synchronization pattern, for transmitting the resetting code after the transmission of the synchronized code, and for transmitting the coded result of the message after transmission of the resetting code.

9. A line decoding apparatus provided in a receiver side of a coded transmission system for receiving coded data, the coded data includes a resetting code, and a coded result, each bit of the coded data having a logical value is coded depending on the coded result of a preceding bit, said apparatus comprising:

preceding code memorizing means for memorizing a stored code representing a code of a bit last received to decode a code of a bit received next;

resetting means for resetting the stored code to a predetermined initial code which indicates a start of a message in response to the resetting code; and decoding means for decoding the coded result received corresponding to the message in accordance with a predetermined coding rule and the code memorized by said preceding code memorizing means.

10. A line decoding apparatus according to claim 9, wherein said apparatuss further comprises violation detecting means for detecting a violation of the predetermined coding rule in the coded data.

11. A line coding apparatus provided in a sender side of a coded mark inversion-coded transmission system for receiving data and for transmitting coded data to a receiver side, the data includes a synchronization pattern, a resetting bit and a message, each bit of the coded data having a logical value is coded in accordance with a coded mark inversion coding rule, said apparatus comprising:

preceding code register for storing a stored code representing a code of a bit last transmitted, the stored code represents a logical value "1" when said preceding code register is reset to an initial code which indicates a start of a message in response to the resetting bit; and transformation logic circuit, operatively connected to said preceding code register for serially receiving the synchronization pattern, the resetting bit after reception of the synchronization pattern, and a message to be transmitted to the receiver side after reception of the resetting bit, for coding each bit of the synchronization pattern and the message in accordance with a predetermined coding rule and the stored code, and for coding the resetting bit to a resetting code, the resetting code is different from the codes used for coding the synchronization pattern and the message.

12. A line decoding apparatus provided in a receiver side of a coded mark inversion-coded transmission system for receiving coded data, the coded data includes a resetting code and a coded message, each bit of the coded data having a logical value is coded in accordance with a coded mark inversion coding rule, said apparatus comprising:

a preceding code register for storing a code of a bit last received and respresents a logical value "1"; and a transformation logic circuit, operatively connected to said preceding code register, including at least a resetting circuit for resetting said preceding code register to a predetermined initial code which indicates a start of a message in response to the resetting code; and a decoding circuit for decoding the coded message received in accordance with the coded mark inversion coding rule and the stored code.

13. A line decoding apparatus according to claim 12, wherein said transformation logic circuit further comprises violation detecting means for detecting a violation of the coded mark inversion coding rule in the coded data.

14. A method for transmitting coded data, said method comprising the steps of:

(a) receiving a message to be transmitted;

(b) generating a resetting bit;

(c) resetting a last transmitted code to an initial code which indicates a start of a message based on the resetting bit;

(d) coding the resetting bit into a reseting code;

(e) coding the message into a coded message in accordance with a predetermined coding rule and the last transmitted code;

(f) transmitting the resetting code followed by the coded message; and (g) storing the last transmitted code.

15. A method according to claim 14, wherein said method transmits the coded data from sender to receiver, wherein steps (a)-(f) are performed by the sender, and wherein said method further comprises the following steps performed by the receiver:

(h) receiving the resetting code from the sender;

(i) resetting a last received code to the initial code in accordance with the resetting code;

(j) receiving the coded message from the sender; and (k) decoding the coded message in accordance with the predetermined coding rule and the last received code.

16. A method according to claim 14, wherein said method further comprises the following steps:

(h) generating a synchronization pattern;

(i) coding the synchronization pattern in accordance with the predetermined coding rule and the last transmitted code to produce a coded synchronization pattern; and (j) transmitting the coded synchronization pattern prior to transmitting the resetting code and the coded message.

17. A line coding apparatus provided in a sender side of a coded transmission system, the coded transmission system transmits data, the data transmitted corresponds to a resetting bit and a message, comprising:

preceding code memorizing means for memorizing a stored code representing a code of a bit last transmitted to code a bit to be transmitted next, and for resetting the stored code to an initial code in response to the resetting bit; and coding means for receiving the resetting bit and the message to be transmitted after the resetting bit, for coding each bit of the message in accordance with a predetermined coding rule and the stored code, and for coding the resetting bit to a predetermined resetting code, the predetermined resetting code is different from the codes used for the coding of the message.

18. A line decoding apparatus provided in a receiver side of a coded transmission system for receiving coded data, the coded data includes a coded result and a resetting code, comprising:

preceding code memorizing means for memorising a stored code representing a code of a bit last received to decode a code of a bit received next;

resetting means for resetting the stored code to a predetermined initial code in response to the resetting code; and decoding means for decoding the coded result received corresponding to the message in accordance with a predetermined coding rule and the stored code.

* * * * *